(12) United States Patent
Cady et al.

(10) Patent No.: US 7,606,048 B2
(45) Date of Patent: *Oct. 20, 2009

(54) INTEGRATED CIRCUIT STACKING SYSTEM

(75) Inventors: James W. Cady, Austin, TX (US); James Wilder, Austin, TX (US); David L. Roper, Austin, TX (US); Russell Rapport, Austin, TX (US); James Douglas Wehrly, Jr., Austin, TX (US); Jeffrey Alan Buchle, Austin, TX (US)

(73) Assignee: Enthorian Technologies, LP, Austin, TX (US)

( * ) Notice: Subject to any disclaimer, the term of this patent is extended or adjusted under 35 U.S.C. 154(b) by 569 days.

This patent is subject to a terminal disclaimer.

(21) Appl. No.: 10/958,584

(22) Filed: Oct. 5, 2004

(65) Prior Publication Data

US 2005/0041402 A1 Feb. 24, 2005

Related U.S. Application Data

(63) Continuation of application No. 10/136,890, filed on May 2, 2002, now Pat. No. 6,940,729, which is a continuation-in-part of application No. 10/005,581, filed on Oct. 26, 2001, now Pat. No. 6,576,992.

(51) Int. Cl.
*H05K 7/10* (2006.01)
*H05K 7/12* (2006.01)

(52) U.S. Cl. .................. 361/767; 361/784; 361/785; 361/803

(58) Field of Classification Search ......... 361/760–803; 174/254–266; 257/700–710, 723–730
See application file for complete search history.

(56) References Cited

U.S. PATENT DOCUMENTS 3,411,122 A 11/1968 Schiller et al.
(Continued)

FOREIGN PATENT DOCUMENTS

DE 004215467 A1 11/1992
(Continued)

OTHER PUBLICATIONS

William R. Newberry, Design Techniques for Ball Grid Arrays, Xynetix Design Systems, Inc., Portland, Maine, Published on the Internet.
(Continued)

*Primary Examiner*—Tuan T Dinh
(74) *Attorney, Agent, or Firm*—Fish & Richardson P.C.

(57) ABSTRACT

The present invention stacks packaged integrated circuits into modules that conserve PWB or other board surface area. The present invention can be used to advantage with packages of a variety of sizes and configurations ranging from larger packaged base elements having many dozens of contacts to smaller packages such as, for example, die-sized packages such as DSBGA. In a preferred embodiment devised in accordance with the present invention, a base element CSP integrated circuit and a support element CSP integrated circuit are aggregated through a flex circuit having at least two conductive layers that are patterned to selectively connect the two CSP elements. A portion of the flex circuit connected to the support element is folded over the base element to dispose the support element above the base element while reducing the overall footprint. The flex circuit provides a thermal and electrical connection path between the module and an application environment such as a printed wiring board (PWB).

20 Claims, 16 Drawing Sheets

U.S. PATENT DOCUMENTS

| | | |
|---|---|---|
| 3,436,604 A | 4/1969 | Hyltin |
| 3,654,394 A | 4/1972 | Gordon |
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 3,983,547 A | 9/1976 | Almasi |
| 4,079,511 A | 3/1978 | Grabbe |
| 4,103,318 A | 7/1978 | Schwede |
| 4,288,841 A | 9/1981 | Gogal |
| 4,398,235 A | 8/1983 | Lutz et al. |
| 4,406,508 A | 9/1983 | Sadigh-Behzadi |
| 4,437,235 A | 3/1984 | McIver |
| 4,513,368 A | 4/1985 | Houseman |
| 4,587,596 A | 5/1986 | Bunnell |
| 4,645,944 A | 2/1987 | Uya |
| 4,696,525 A | 9/1987 | Coller et al. |
| 4,712,129 A | 12/1987 | Orcutt |
| 4,722,691 A | 2/1988 | Gladd et al. |
| 4,733,461 A | 3/1988 | Nakano |
| 4,758,875 A | 7/1988 | Fujisaki et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,839,717 A | 6/1989 | Phy et al. |
| 4,862,249 A | 8/1989 | Carlson |
| 4,884,237 A | 11/1989 | Mueller et al. |
| 4,891,789 A | 1/1990 | Quattrini et al. |
| 4,911,643 A | 3/1990 | Perry et al. |
| 4,953,060 A | 8/1990 | Lauffer et al. |
| 4,956,694 A | 9/1990 | Eide |
| 4,983,533 A | 1/1991 | Go |
| 4,985,703 A | 1/1991 | Kaneyama |
| 5,012,323 A | 4/1991 | Farnworth |
| 5,016,138 A | 5/1991 | Woodman |
| 5,034,350 A | 7/1991 | Marchisi |
| 5,041,015 A | 8/1991 | Travis |
| 5,041,902 A | 8/1991 | McShane |
| 5,057,903 A | 10/1991 | Olla |
| 5,064,782 A | 11/1991 | Nishiguchi |
| 5,068,708 A | 11/1991 | Newman |
| 5,081,067 A | 1/1992 | Shimizu et al. |
| 5,099,393 A | 3/1992 | Bentlage et al. |
| 5,104,820 A | 4/1992 | Go et al. |
| 5,117,282 A | 5/1992 | Salatino |
| 5,122,862 A | 6/1992 | Kajihara et al. |
| 5,138,430 A | 8/1992 | Gow, 3rd et al. |
| 5,138,434 A | 8/1992 | Wood et al. |
| 5,158,912 A | 10/1992 | Kellerman et al. |
| 5,159,434 A | 10/1992 | Kohno et al. |
| 5,159,535 A | 10/1992 | Desai et al. |
| 5,168,926 A | 12/1992 | Watson et al. |
| 5,198,888 A | 3/1993 | Sugano et al. |
| 5,198,965 A | 3/1993 | Curtis et al. |
| 5,214,307 A | 5/1993 | Davis |
| 5,219,794 A | 6/1993 | Satoh et al. |
| 5,222,014 A | 6/1993 | Lin |
| 5,224,023 A | 6/1993 | Smith et al. |
| 5,229,916 A | 7/1993 | Frankeny et al. |
| 5,239,198 A | 8/1993 | Lin et al. |
| 5,240,588 A | 8/1993 | Uchida |
| 5,241,454 A | 8/1993 | Ameen et al. |
| 5,243,133 A | 9/1993 | Engle et al. |
| 5,247,423 A | 9/1993 | Lin et al. |
| 5,252,855 A | 10/1993 | Ogawa et al. |
| 5,252,857 A | 10/1993 | Kane et al. |
| 5,259,770 A | 11/1993 | Bates et al. |
| 5,261,068 A | 11/1993 | Gaskins et al. |
| 5,262,927 A | 11/1993 | Chia et al. |
| 5,276,418 A | 1/1994 | Klosowiak et al. |
| 5,279,029 A | 1/1994 | Burns |
| 5,281,852 A | 1/1994 | Normington |
| 5,289,062 A | 2/1994 | Wyland |
| 5,311,401 A | 5/1994 | Gates, Jr. et al. |
| 5,313,097 A | 5/1994 | Haj-Ali-Ahmadi et al. |
| 5,343,075 A | 8/1994 | Nishino |
| 5,347,428 A | 9/1994 | Carson et al. |
| 5,357,478 A | 10/1994 | Kikuda et al. |
| 5,361,228 A | 11/1994 | Adachi et al. |
| 5,362,656 A | 11/1994 | McMahon |
| 5,375,041 A | 12/1994 | McMahon |
| 5,377,077 A | 12/1994 | Burns |
| 5,386,341 A | 1/1995 | Olson et al. |
| 5,394,010 A | 2/1995 | Tazawa et al. |
| 5,394,303 A | 2/1995 | Yamaji |
| 5,397,916 A | 3/1995 | Normington |
| 5,402,006 A | 3/1995 | O'Donley |
| 5,420,751 A | 5/1995 | Burns |
| 5,428,190 A | 6/1995 | Stopperan |
| 5,438,224 A | 8/1995 | Papageorge et al. |
| 5,446,620 A | 8/1995 | Burns et al. |
| 5,448,511 A | 9/1995 | Paurus et al. |
| 5,455,740 A | 10/1995 | Burns |
| 5,475,920 A | 12/1995 | Burns et al. |
| 5,477,082 A | 12/1995 | Buckley, III et al. |
| 5,479,318 A | 12/1995 | Burns |
| 5,484,959 A | 1/1996 | Burns |
| 5,493,476 A | 2/1996 | Burns |
| 5,499,160 A | 3/1996 | Burns |
| 5,502,333 A | 3/1996 | Bertin et al. |
| 5,514,907 A | 5/1996 | Moshayedi |
| 5,523,619 A | 6/1996 | McAllister et al. |
| 5,523,695 A | 6/1996 | Lin |
| 5,541,812 A | 7/1996 | Burns |
| 5,543,664 A | 8/1996 | Burns |
| 5,561,591 A | 10/1996 | Burns |
| 5,566,051 A | 10/1996 | Burns |
| 5,572,065 A | 11/1996 | Burns |
| 5,588,205 A | 12/1996 | Roane |
| 5,592,364 A | 1/1997 | Roane |
| 5,594,275 A | 1/1997 | Kwon et al. |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner, Jr. et al. |
| 5,654,877 A | 8/1997 | Burns |
| 5,657,537 A | 8/1997 | Saia et al. |
| 5,677,569 A | 10/1997 | Choi et al. |
| 5,717,556 A | 2/1998 | Yanagida |
| 5,729,894 A | 3/1998 | Rostoker et al. |
| 5,744,827 A | 4/1998 | Jeong et al. |
| 5,751,553 A | 5/1998 | Clayton |
| 5,763,296 A | 6/1998 | Casati et al. |
| 5,764,497 A | 6/1998 | Mizumo et al. |
| 5,776,797 A | 7/1998 | Nicewarner, Jr. et al. |
| 5,778,522 A | 7/1998 | Burns |
| 5,783,464 A | 7/1998 | Burns |
| 5,789,815 A | 8/1998 | Tessier et al. |
| 5,801,437 A | 9/1998 | Burns |
| 5,801,439 A | 9/1998 | Fujisawa et al. |
| 5,804,870 A | 9/1998 | Burns |
| 5,805,422 A | 9/1998 | Otake et al. |
| 5,828,125 A | 10/1998 | Burns |
| 5,835,988 A | 11/1998 | Ishii |
| 5,841,721 A | 11/1998 | Kwon et al. |
| 5,852,326 A | 12/1998 | Khandros et al. |
| 5,869,353 A | 2/1999 | Levy et al. |
| 5,895,970 A | 4/1999 | Miyoshi et al. |
| 5,899,705 A | 5/1999 | Akram |
| 5,917,709 A | 6/1999 | Johnson et al. |
| 5,922,061 A | 7/1999 | Robinson |
| 5,925,934 A | 7/1999 | Lim |

| | | | | | | |
|---|---|---|---|---|---|---|
| 5,926,369 | A | 7/1999 | Ingraham et al. | 6,509,639 B1 | 1/2003 | Lin |
| 5,949,657 | A | 9/1999 | Karabatsos | 6,514,793 B2 | 2/2003 | Isaak |
| 5,953,215 | A | 9/1999 | Karabatsos | 6,528,870 B2 | 3/2003 | Fukatsu et al. |
| 5,956,234 | A * | 9/1999 | Mueller ................... 361/767 | 6,552,910 B1 | 4/2003 | Moon et al. |
| 5,959,839 | A | 9/1999 | Gates | 6,560,117 B2 | 5/2003 | Moon |
| 5,963,427 | A | 10/1999 | Bolleson | 6,572,387 B2 | 6/2003 | Burns et al. |
| 5,973,395 | A | 10/1999 | Suzuki et al. | 6,576,992 B1 | 6/2003 | Cady et al. |
| 5,995,370 | A | 11/1999 | Nakamori | 6,588,095 B2 | 7/2003 | Pan |
| 6,002,167 | A | 12/1999 | Hatano et al. | 6,590,282 B2 | 7/2003 | Wang et al. |
| 6,002,589 | A | 12/1999 | Perino et al. | 6,600,222 B1 | 7/2003 | Levardo |
| 6,014,316 | A | 1/2000 | Eide | 6,614,664 B2 | 9/2003 | Lee |
| 6,025,642 | A | 2/2000 | Burns | 6,620,651 B2 | 9/2003 | He et al. |
| 6,028,352 | A | 2/2000 | Eide | 6,627,984 B2 | 9/2003 | Bruce et al. |
| 6,028,365 | A | 2/2000 | Akram et al. | 6,657,134 B2 | 12/2003 | Spielberger et al. |
| 6,034,878 | A | 3/2000 | Osaka et al. | 6,660,561 B2 | 12/2003 | Forthun |
| 6,040,624 | A | 3/2000 | Chambers et al. | 6,677,670 B2 | 1/2004 | Kondo |
| 6,072,233 | A | 6/2000 | Corisis et al. | 6,683,377 B1 | 1/2004 | Shim et al. |
| 6,084,293 | A | 7/2000 | Ohuchi | 6,690,584 B2 | 2/2004 | Uzuka et al. |
| 6,084,294 | A | 7/2000 | Tomita | 6,699,730 B2 | 3/2004 | Kim et al. |
| 6,097,087 | A | 8/2000 | Farnworth et al. | 6,707,684 B1 | 3/2004 | Andric et al. |
| 6,121,676 | A | 9/2000 | Solberg | 6,709,893 B2 | 3/2004 | Moden et al. |
| RE36,916 | E | 10/2000 | Moshayedi | 6,768,660 B2 | 7/2004 | Kong et al. |
| 6,157,541 | A | 12/2000 | Hacke | 6,781,240 B2 | 8/2004 | Choi et al. |
| 6,165,817 | A | 12/2000 | Akram | 6,803,651 B1 | 10/2004 | Chiang |
| 6,172,874 | B1 | 1/2001 | Bartilson | 6,812,567 B2 | 11/2004 | Kim et al. |
| 6,178,093 | B1 | 1/2001 | Bhatt et al. | 6,833,984 B1 | 12/2004 | Belgacem |
| 6,187,652 | B1 | 2/2001 | Chou et al. | 6,849,949 B1 | 2/2005 | Lyu et al. |
| 6,205,654 | B1 | 3/2001 | Burns | 6,867,496 B1 | 3/2005 | Hashimoto |
| 6,208,521 | B1 | 3/2001 | Nakatsuka | 6,869,825 B2 | 3/2005 | Chiu |
| 6,222,737 | B1 | 4/2001 | Ross | 6,876,074 B2 | 4/2005 | Kim |
| 6,225,688 | B1 | 5/2001 | Kim et al. | 6,884,653 B2 | 4/2005 | Larson |
| 6,233,650 | B1 | 5/2001 | Johnson et al. | 6,891,729 B2 | 5/2005 | Ko et al. |
| 6,234,820 | B1 | 5/2001 | Perino et al. | 6,908,792 B2 | 6/2005 | Bruce et al. |
| 6,262,476 | B1 | 7/2001 | Vidal | 6,914,324 B2 | 7/2005 | Rapport et al. |
| 6,262,895 | B1 | 7/2001 | Forthun | 6,919,626 B2 | 7/2005 | Burns |
| 6,265,660 | B1 | 7/2001 | Tandy | 6,965,166 B2 | 11/2005 | Hikita et al. |
| 6,266,252 | B1 | 7/2001 | Karabatsos | 7,180,167 B2 | 2/2007 | Partridge et al. |
| 6,281,577 | B1 | 8/2001 | Oppermann et al. | 2001/0006252 A1 | 7/2001 | Kim et al. |
| 6,285,560 | B1 | 9/2001 | Lyne | 2001/0013423 A1 | 8/2001 | Dalal et al. |
| 6,288,907 | B1 | 9/2001 | Burns | 2001/0015487 A1 | 8/2001 | Forthun |
| 6,300,679 | B1 | 10/2001 | Mukerji et al. | 2001/0035572 A1 | 11/2001 | Isaak |
| 6,303,981 | B1 | 10/2001 | Moden | 2001/0040793 A1 | 11/2001 | Inaba |
| 6,310,392 | B1 | 10/2001 | Burns | 2002/0006032 A1 | 1/2002 | Karabatsos |
| 6,313,998 | B1 | 11/2001 | Kledzik | 2002/0030995 A1 | 3/2002 | Shoji |
| 6,316,825 | B1 | 11/2001 | Park et al. | 2002/0048849 A1 | 4/2002 | Isaak |
| 6,323,060 | B1 | 11/2001 | Isaak | 2002/0076919 A1 | 6/2002 | Peters et al. |
| 6,329,708 | B1 | 12/2001 | Komiyama | 2002/0101261 A1 | 8/2002 | Karabatsos |
| 6,336,262 | B1 | 1/2002 | Dalal et al. | 2002/0114143 A1 | 8/2002 | Morrison et al. |
| 6,351,029 | B1 | 2/2002 | Isaak | 2002/0139577 A1 | 10/2002 | Miller |
| 6,360,433 | B1 | 3/2002 | Ross | 2002/0164838 A1 | 11/2002 | Moon et al. |
| 6,368,896 | B2 | 4/2002 | Farnworth et al. | 2002/0180022 A1 | 12/2002 | Emoto |
| 6,376,769 | B1 | 4/2002 | Chung | 2003/0016710 A1 | 1/2003 | Komoto |
| 6,384,339 | B1 | 5/2002 | Neuman | 2003/0045025 A1 | 3/2003 | Coyle et al. |
| 6,392,162 | B1 | 5/2002 | Karabatsos | 2003/0049886 A1 | 3/2003 | Salmon |
| 6,410,857 | B1 | 6/2002 | Gonya | 2003/0081392 A1 | 5/2003 | Cady et al. |
| 6,426,240 | B2 | 7/2002 | Isaak | 2003/0107118 A1 | 6/2003 | Pflughaupt et al. |
| 6,426,549 | B1 | 7/2002 | Isaak | 2003/0109078 A1 | 6/2003 | Takahashi et al. |
| 6,426,560 | B1 | 7/2002 | Kawamura et al. | 2003/0168725 A1 | 9/2003 | Warner et al. |
| 6,433,418 | B1 | 8/2002 | Fujisawa et al. | 2004/0000708 A1 | 1/2004 | Rapport et al. |
| 6,444,490 | B2 | 9/2002 | Bertin et al. | 2004/0021211 A1 | 2/2004 | Damberg |
| 6,444,921 | B1 | 9/2002 | Wang et al. | 2004/0031972 A1 | 2/2004 | Pflughaupt et al. |
| 6,446,158 | B1 | 9/2002 | Karabatsos | 2004/0045159 A1 | 3/2004 | DiStefano et al. |
| 6,449,159 | B1 | 9/2002 | Haba | 2004/0065963 A1 | 4/2004 | Karnezos |
| 6,452,826 | B1 | 9/2002 | Kim et al. | 2004/0075991 A1 | 4/2004 | Haba et al. |
| 6,462,412 | B2 | 10/2002 | Kamei et al. | 2004/0099938 A1 | 5/2004 | Kang et al. |
| 6,465,877 | B1 | 10/2002 | Farnworth et al. | 2004/0104470 A1 | 6/2004 | Bang et al. |
| 6,465,893 | B1 | 10/2002 | Khandros et al. | 2004/0115866 A1 | 6/2004 | Bang et al. |
| 6,473,308 | B2 | 10/2002 | Forthun | 2004/0150107 A1 | 8/2004 | Cha et al. |
| 6,486,544 | B1 | 11/2002 | Hashimoto | 2004/0157362 A1 | 8/2004 | Beroz et al. |
| 6,489,178 | B2 | 12/2002 | Coyle et al. | 2004/0203190 A1 | 10/2004 | Pflughaupt et al. |
| 6,489,687 | B1 | 12/2002 | Hashimoto | 2004/0217461 A1 | 11/2004 | Damberg |
| 6,492,718 | B2 | 12/2002 | Ohmori | 2004/0217471 A1 | 11/2004 | Haba |
| 6,504,104 | B2 | 1/2003 | Hacke et al. | 2004/0238931 A1 | 12/2004 | Haba et al. |

| | | | |
|---|---|---|---|
| 2004/0245617 A1 | 12/2004 | Damberg et al. | |
| 2005/0018495 A1 | 1/2005 | Bhakta et al. | |
| 2005/0035440 A1 | 2/2005 | Mohammed | |
| 2005/0040508 A1 | 2/2005 | Lee | |
| 2005/0133897 A1 | 6/2005 | Baek et al. | |

FOREIGN PATENT DOCUMENTS

| | | | |
|---|---|---|---|
| DE | 004214102 A1 | 12/1992 | |
| EP | 0426-303 A2 | 10/1990 | |
| EP | 461-639 A | 12/1991 | |
| JP | 359088863 A | 5/1984 | |
| JP | 60-254762 A | 12/1985 | |
| JP | 3641047659 A | 3/1986 | |
| JP | 62-230027 A | 8/1987 | |
| JP | 4-209562 A | 7/1992 | |
| JP | 404368167 A | 12/1992 | |
| JP | 5029534 A | 2/1993 | |
| JP | 63-153849 A | 6/1998 | |
| JP | 2000-88921 | 3/2000 | |
| JP | 2000-88921 A | 3/2000 | |
| JP | 2000/307029 A | 11/2000 | |
| JP | 3802000 B2 | 11/2000 | |
| JP | 2001077294 A | 3/2001 | |
| JP | 2001085592 A | 3/2001 | |
| JP | 2001332683 A | 11/2001 | |
| JP | 2003037246 A | 2/2003 | |
| JP | 2003086760 A | 3/2003 | |
| JP | 2003086761 A | 3/2003 | |
| JP | 2003/309247 A | 10/2003 | |
| JP | 2003309246 A | 10/2003 | |
| JP | 2003/347475 A | 12/2003 | |
| JP | 2003/347503 A | 12/2003 | |
| WO | WO 97/44824 | 11/1997 | |
| WO | WO 03/037053 A1 | 5/2003 | |

OTHER PUBLICATIONS

Tessera Technologies, Inc.—Semiconductor Intellectual Property, Chip Scale Packaging—Website pages (3), Published on Internet.
Tessera Introduces uZ ã—Ball Stacked Memory Package for Computing and Portable Electronic Products, Oyce Smaragdis, Tessera Public Relations, Sandy Skees, MCA PR (www.tessera.com/news_events/press_coverage.cfm); 2 figures that purport to be directed to the uZ ã—Ball Stacked Memory Package. Published Jul. 17, 2002, San Jose, CA.
Ron Bauer, Intel. "Stacked-CSP Delivers Flexibility, Reliability, and Space-Saving Capabilities", Spring 2002, Published on the Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Webiste 9 pages) Fjelstad, Joseph, Pacific Consultants L.LC., Published Jan. 2001 on Internet.
Flexible Thinking: Examining the Flexible Circuit Tapes. (Website 2 pages) Fjelstad, Joseph., Published Apr. 20, 2000 on Internet.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Flexible Printed Circuit Technology—A Versatile Interconnection Option. (Website 2 pages) Fjelstad, Joseph. Dec. 3, 2002.
Chip Scale Packaging and Redistribution, Paul A. Magill, Glenn A. Rinne, J. Daniel Mis, Wayne C. Machon, Joseph W. Baggs, Unitive Electronics Inc.
Dense-Pac Microsystems, 16 Megabit High Speed CMOS SRAM DPS1MX16MKn3.
Dense-Pac Microsystems, 256 Megabyte CMOS DRAM DP3ED32MS72RW5.
Dense-Pac Microsystems, Breaking Space Barriers, 3-D Technology 1993.
Dense-Pac Microsystems, DPS512x16A3, Ceramic 512Kx16 CMOS SRAM Module.
IBM Preliminary 168 Pin SDRAM Registered DIMM Functional Description & Timing Diagrams.
3D Interconnection for Ultra-Dense Multichip Modules, Christian Val, Thomson-CSF DCS Computer Division, Thierry Lemoine, Thomson-CSF RCM Radar Countermeasures Division.
High Density Memory Packaging Technology High Speed Imaging Applications, Dean Frew, Texas Instruments Incorporated.
Vertically-Intergrated Package, Alvin Weinberg, Pacesetter, Inc. and W. Kinzy Jones, Florida International University.
1992 Proceedings, 42nd Electronic Components & Technology Conference, May 18-20, 1992.
Research Disclosure, Organic Card Device Carrier, 31318, May 1990, No. 313.
IBM Technical Disclosure Bulletin, vol. 23, No. 12, May 1981.
IBM Technical Disclosure Bulletin, vol. 20, No. 11A, Apr. 1978.
IBM Technical Disclosure Bulletin, vol. 32, No. 3B, Aug. 1989.
Orthogonal Chip Mount—A 3D Hybrid Wafer Scale Integration Technology, International Electron Device Meeting, IEDM Technical Digest, Washington, D.C., Dec. 6-9, 1987.
Search Report and Written Opinion; mailed Oct. 17, 2006; PCT/US2006/017015.

* cited by examiner

INTEGRATED CIRCUIT STACKING SYSTEM

RELATED APPLICATIONS

This application is a continuation of U.S. application Ser. No. 10/136,890, filed May 2, 2002, now U.S. Pat. No. 6,940,729; which is a continuation-in-part of U.S. application Ser. No. 10/005,581, filed Oct. 26, 2001, now U.S. Pat. No. 6,576,992 B1, issued Jun. 10, 2003. U.S. Pat. No. 6,576,992 B1 is hereby incorporated by reference for all purposes.

TECHNICAL FIELD

The present invention relates to aggregating integrated circuits and, in particular, to stacking dissimilar integrated circuits. packages. In some stacks, the leads of the packaged integrated circuits are used to create a stack, while in other systems, added structures such as rails provide all or part of the interconnection between packages. In still other techniques, flexible conductors with certain characteristics are used to selectively interconnect packaged integrated circuits.

One major package configuration employed during the past decade has encapsulated an integrated circuit (IC) in a plastic surround typically having a rectangular configuration. The enveloped integrated circuit is connected to the application environment through leads emergent from the edge periphery of the plastic encapsulation. Such "leaded packages" have been the constituent elements most commonly employed by techniques for stacking packaged integrated circuits.

Leaded packages play an important role in electronics, but efforts to miniaturize electronic components and assemblies have driven development of technologies that preserve circuit board surface area. Because leaded packages have leads emergent from peripheral sides of the package, leaded packages occupy more than a minimal amount of circuit board surface area. Consequently, alternatives to leaded packages have recently gained market share.

One family of alternative packages is identified generally by the term "chip scale packaging" or CSP. These differ from leaded packages in that the CSP packages provide connection to an integrated circuit through a set of contacts (often embodied as "bumps," "spheres," or "balls") arrayed across a major surface of the package. Instead of leads emergent from a peripheral side of the package, contacts are placed on a major surface and typically emerge from the planar bottom surface of the package.

The goal of CSP is to occupy as little area as possible and, preferably, approximately the area of the encapsulated IC. Therefore, CSP contacts do not typically extend beyond the outline perimeter of the package. The absence of "leads" on package sides renders most stacking techniques devised for leaded packages inapplicable for CSP stacking.

CSP has enabled reductions in size and weight parameters for many applications. CSP is a broad category that can include a variety of packages from larger than chip scale to die-sized packages such as the die-sized ball grid array (DS-BGA) described in proposed JEDEC standard 95-1 for DSBGA.

To meet the continuing demands for cost and form factor reduction with increasing memory capacities, CSP technologies that aggregate integrated circuits in CSP technology have recently been developed. For example, Sharp, Hitachi, Mitsubishi and Intel recently undertook support of what are called the S-CSP specifications for flash and SRAM applications. Those S-CSP specifications describe, however, stacking multiple die within a single chip scale package and do not provide a technology for stacking chip scale packages. Stacking integrated circuits within a single package requires specialized technology that includes reformulation of package internals and significant expense with possible supply chain vulnerabilities.

There are several known techniques for stacking packages articulated in chip scale technology. The assignee of the present invention has developed previous systems for aggregating FBGA packages in space saving topologies. The assignee of the present invention has systems for stacking BGA packages on a DIMM in a RAMBUS environment.

In U.S. Pat. No. 6,205,654 B1, owned by the assignee of the present invention, a system for stacking ball grid array packages that employs lead carriers to extend connectable points out from the packages is described. Other known techniques add structures to a stack of BGA-packaged ICs. Still others aggregate CSPs on a DIMM with angular placement of the packages. Such techniques provide alternatives, but require topologies of added cost and complexity.

U.S. Pat. No. 6,262,895 B1 to Forthun (the "Forthun patent") purports to disclose a technique for stacking chip scale packaged ICs. The Forthun patent discloses a "package" that exhibits a flex circuit wrapped partially about a CSP. The flex circuit is said to have pad arrays on upper and lower surfaces of the flex.

The flex circuit of the Forthun. "package" has a pad array on its upper surface and a pad array centrally located upon its lower surface. On the lower surface of the flex there are third and fourth arrays on opposite sides from the central lower surface pad array. To create the package of Forthun, a CSP contacts the pad array located on the upper surface of the flex circuit. As described in the Forthun patent, the contacts on the lower surface of the CSP are pushed through "slits" in the upper surface pads and advanced through the flex to protrude from the pads of the lower surface array and, therefore, the bottom surface of the package. Thus, the contacts of the CSP serve as the contacts for the package. The sides of the flex are partially wrapped about the CSP to adjacently place the third and fourth pad arrays above the upper major surface of the CSP to create from the combination of the third and fourth pad arrays, a fifth pad array for connection to another such package. Thus, as described in the Forthun disclosure, a stacked module of CSPs created with the described packages will exhibit a flex circuit wrapped about each CSP in the module.

Most previous known methods for stacking aggregate similarly packaged integrated circuits. What is needed are methods and structures for stacking dissimilar packages and circuits in thermally efficient, reliable structures.

SUMMARY OF THE INVENTION

The present invention stacks packaged integrated circuits into modules that conserve PWB or other board surface area. The invention provides techniques and structures for aggregating chip scale-packaged integrated circuits (CSPs) or leaded packages with other CSPs or with monolithic or stacked leaded packages into modules that conserve PWB or other board surface area. The present invention can be used to advantage with CSP or leaded packages of a variety of sizes and configurations ranging from larger packaged base elements having many dozens of contacts to smaller packages such as, for example, die-sized packages such as DSBGA. Although the present invention is applied most frequently to packages that contain one die, it may be employed with packages that include more than one integrated circuit die.

In a preferred embodiment devised in accordance with the present invention, a base element IC and a support element IC are aggregated through a flex circuit having two conductive layers that are patterned to selectively connect the two IC elements. Simpler embodiments may use a one conductive layer flex. A portion of the flex circuit connected to the support element is folded over the base element to dispose the support element above the base element while reducing the overall footprint occupied by the two ICs. The flex circuit connects the ICs and provides a thermal and electrical connection path between the module and an application environment such as a printed wiring board (PWB).

The present invention may be employed to advantage in numerous configurations and combinations in modules provided for high-density memories, high capacity computing, or particular applications where small size is valued.

DESCRIPTION OF PREFERRED EMBODIMENTS

Figure 1:
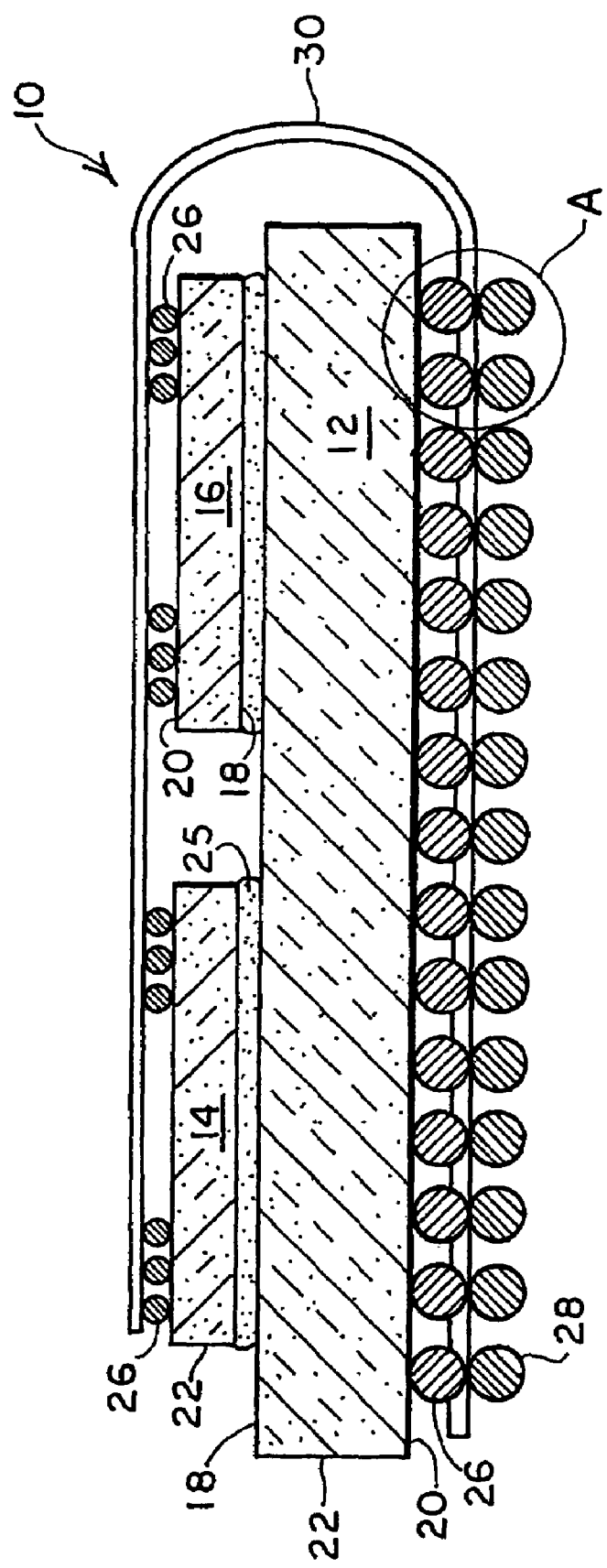
FIG. 1 is an elevation view of module 10 devised in accordance with a preferred embodiment of the present invention.

FIG. 1 is an elevation view of module 10 devised in accordance with a preferred embodiment of the present invention. FIG. 1 depicts a three-element preferred embodiment of the invention. The invention may, however, be employed with greater or fewer than three IC elements. Module 10 is comprised of a base element 12 and support elements 14 and 16. In the depicted embodiment, base element 12 and support elements 14 and 16 are shown as CSP devices, but the invention is not limited to arrangements of CSPs and may be employed to aggregate a variety of package types. Base element 12 and support elements 14 and 16 each have, in the depicted embodiment, upper surfaces 18 and lower surfaces 20 and peripheral or lateral sides 22. Lateral sides 22 may be in the character of sides or may, if the CSP is especially thin, be in the character of an edge. For example, in addition to the well known leaded and CSP packages, the present invention may be employed with packaged ICs that do not exhibit what would be considered a lateral side 22 such as, for example, die that are packaged to have edge-wise protective layers or coatings and a connective structure across the bottom surface of the die while leaving uncovered the upper surface of the die. Such packages are employed in DRAM circuitry and may be aggregated using the present invention.

The invention is employed to advantage with a variety of combinations of packages including leaded and CSP and other configurations of packaged ICs. CSPs of a variety of types and configurations such as, for example, those that are larger than die-sized, as well those that are at or near die size as well as the variety of ball grid array packages known in the art may be employed to advantage by the invention. Collectively, these will be known herein as chip scale packaged integrated circuits (CSPs) and some preferred embodiments will be described in terms of CSPs, but the particular configurations used in the explanatory figures are not, however, to be construed as limiting. For example, the elevation view of FIG. 1 is depicted with CSPs of a particular profile, but it should be understood that the figures are exemplary only. Later figures show embodiments of the invention that employ CSPs of other configurations aggregated with leaded packages as an example of some of the many alternative IC package configurations and combinations with which the invention may be employed. The system of the invention may also be employed with leaded packages while the module itself presents an array of bumps or balls to the application environment.

The invention may be employed to advantage with many of the wide range of CSP and leaded package configurations available in the art. One preferred embodiment of the invention employs a CSP microprocessor as base element 12 and memory circuits packaged in a variety of configurations as support elements 14 and 16, but those of skill in the art will recognize that the invention may be employed to advantage with logic and computing circuits where reduction of PWB or other board surface area consumption is desired.

Typical CSPs, such as, for example, ball-grid-array ("BGA"), micro-ball-grid array, and fine-pitch ball grid array ("FBGA") packages have an array of connective contacts embodied, for example, as bumps, solder balls, or balls that extend from lower surface 20 of a plastic casing in any of several patterns and pitches. An external portion of the connective contacts is often finished with a ball of solder. Shown in FIG. 1 are CSP contacts 26 along lower surfaces 20 of elements 12, 14, and 16. Contact with the integrated circuit within the respective packages is provided by CSP contacts 26.

FIG. 1 depicts base element 12 and support elements 14 and 16 in a stacked disposition with upper major surfaces of the constituent elements being proximally located in this back to back configuration. Between upper sides 18 of support elements 14 and 16 and upper side 18 of base element 12 is shown adhesive layer 25 shown in exaggerated scale for clarity of depiction. CSP contacts 26 are emergent from lower side 20 of base element 12 and support elements 14 and 16. Module contacts 28 are shown depicted along the bottom of module 10 and provide connection for the module to a PWB or PCB or other mounting site.

In FIG. 1, flex circuit ("flex", "flex circuit", "flexible circuit structure") 30 is shown partially wrapped about base element 12 and support elements 14 and 16. Any flexible or conformable substrate with a multiple internal layer connectivity capability may be used as a flex circuit in the invention. Some embodiments may employ more than one flex. The entire flex circuit may be flexible or, as those of skill in the art will recognize, a PCB structure made flexible in certain areas to allow conformability in some areas and rigid in other areas for planarity along contact surfaces may be employed as an alternative flex circuit in the present invention. For example, structures known as rigid-flex may be employed.

Support elements 14 and 16 are preferably fixed to upper surface 18 of base element 12 by adhesive 25 which is shown as a tape adhesive, but may be a liquid adhesive or may be placed in discrete locations across the package. Preferably, adhesive 25 is thermally conductive. Adhesives that include a flux may be used to advantage in assembly of module 10. Layer 25 may also be a thermally conductive medium to encourage heat flow between the elements of module 10. Alternatively, a mechanical clamp or clamps may be used to hold the base and support elements together. Differing embodiments of the invention will place one or more support elements in a stacked disposition relative to a base element. The contacts for the module itself may be closer to either the base element or the support element(s) of the module although more typically and preferably, the module contacts will be closer to the base element. The support elements may also extend over the edges of the base element or may be disposed within the perimeter of the base element.

Flex circuit 30 is, in a preferred embodiment, a multi-layer flexible circuit structure that has at least two conductive layers. Other embodiments may employ, if the circuit is simple enough, a flex with one conductive layer. Preferably, the conductive layers are copper. The use of plural conductive layers provides connection advantages that simplify the interconnection schemes used to interconnect elements 12, 14 and 16. Multiple conductive layers also provide the opportunity, when there is sufficient routing area available, to manage capacitance and inductance issues better than a single conductive layer.

Figure 2:
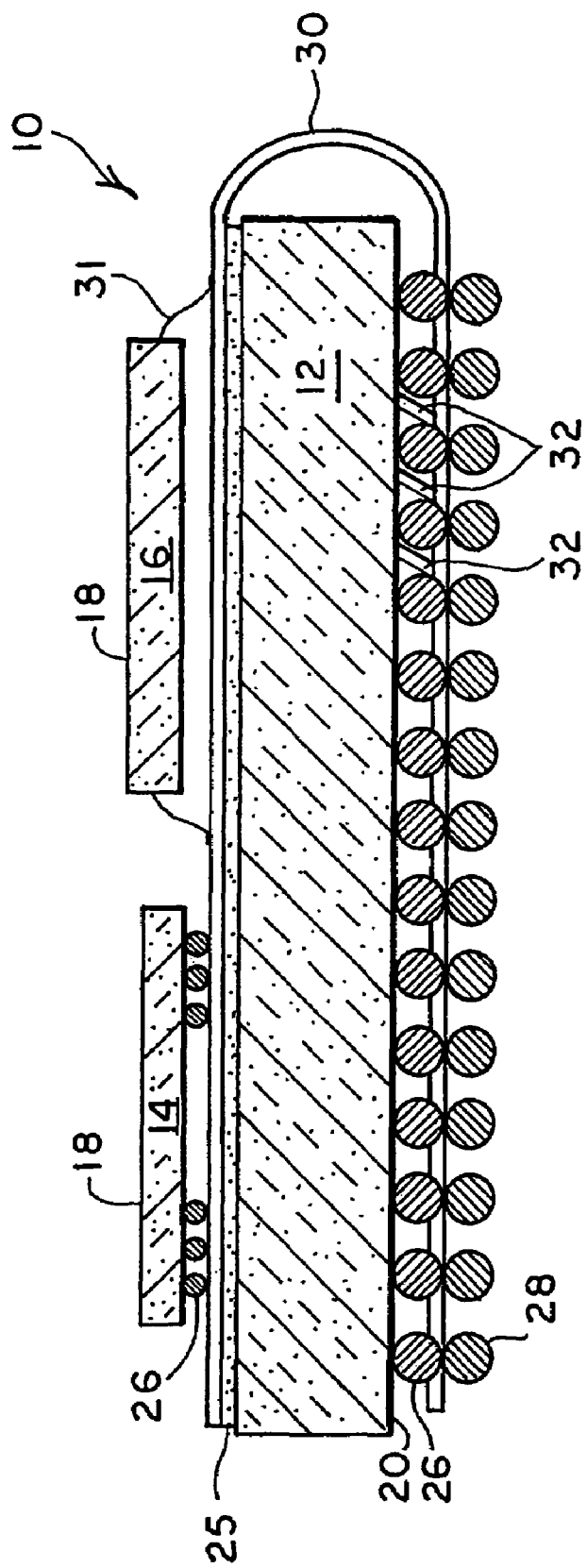
FIG. 2 is an elevation view of module 10 devised in accordance with an alternative preferred embodiment of the present invention.

FIG. 2 shows a module 10 devised in accordance with an alternative preferred embodiment of the invention. FIG. 2 illustrates the aggregation of a leaded package device having leads 31 (i.e., as support element 16 in this embodiment) with base element 12 and support element 14. FIG. 2 further depicts the placement of flex 30 attached to the upper side of base element 12 with the placement of support elements 14 and 16 in a position relatively above flex 30 rather than below as earlier shown in FIG. 1. Flex 30 is preferably attached to upper side 18 of base element 12 with a thermally conductive adhesive depicted by reference 25 in FIG. 2. A conformal media 32 is indicated in FIG. 2 as being placed between CSP contacts 26 to assist in creating conformality of structural areas of module 10. Preferably, conformal media 32 is thermally conductive and is placed along the lower surface 20 of base element 12 although to preserve clarity of the view, its placement between only a few CSP contacts 26 of base element 12 is shown in the FIG. 2.

Figure 3:
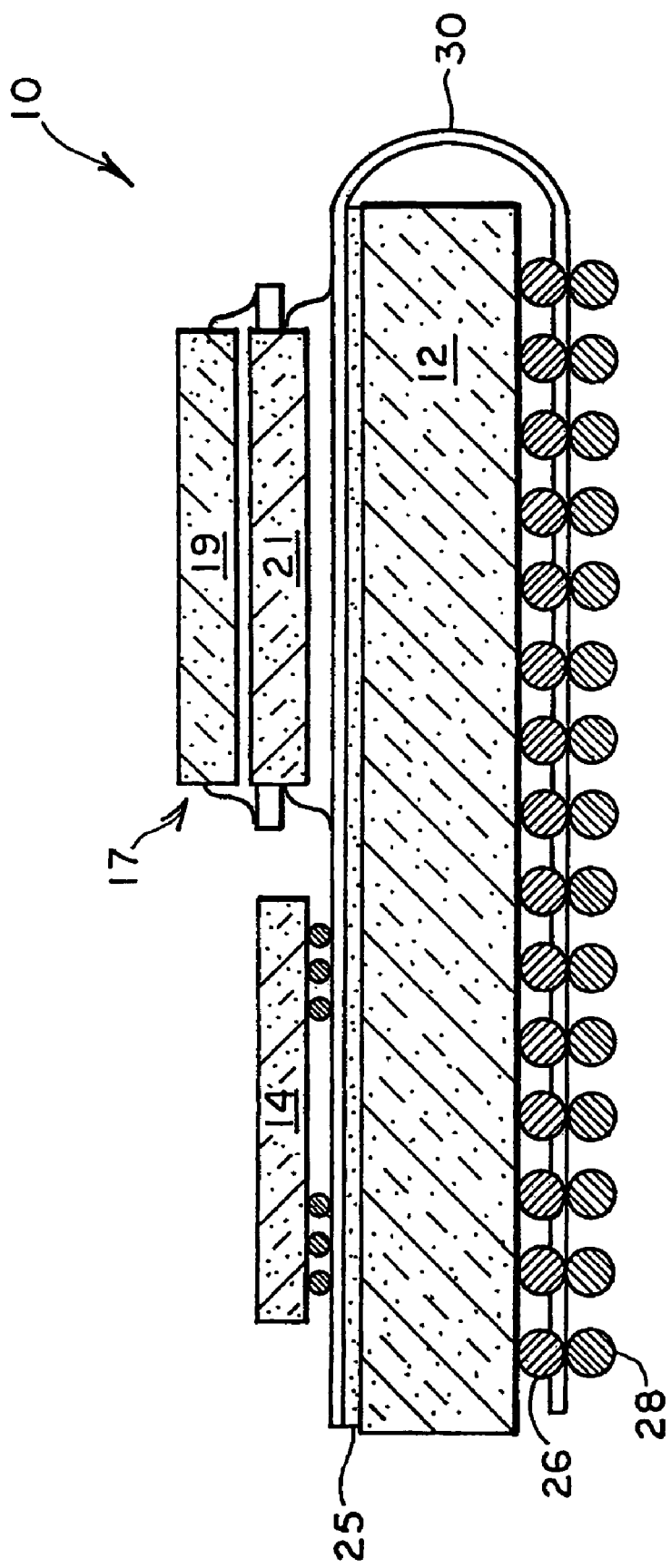
FIG. 3 is an elevation view of module 10 devised in accordance with an alternative preferred embodiment of the present invention.
Figure 4:
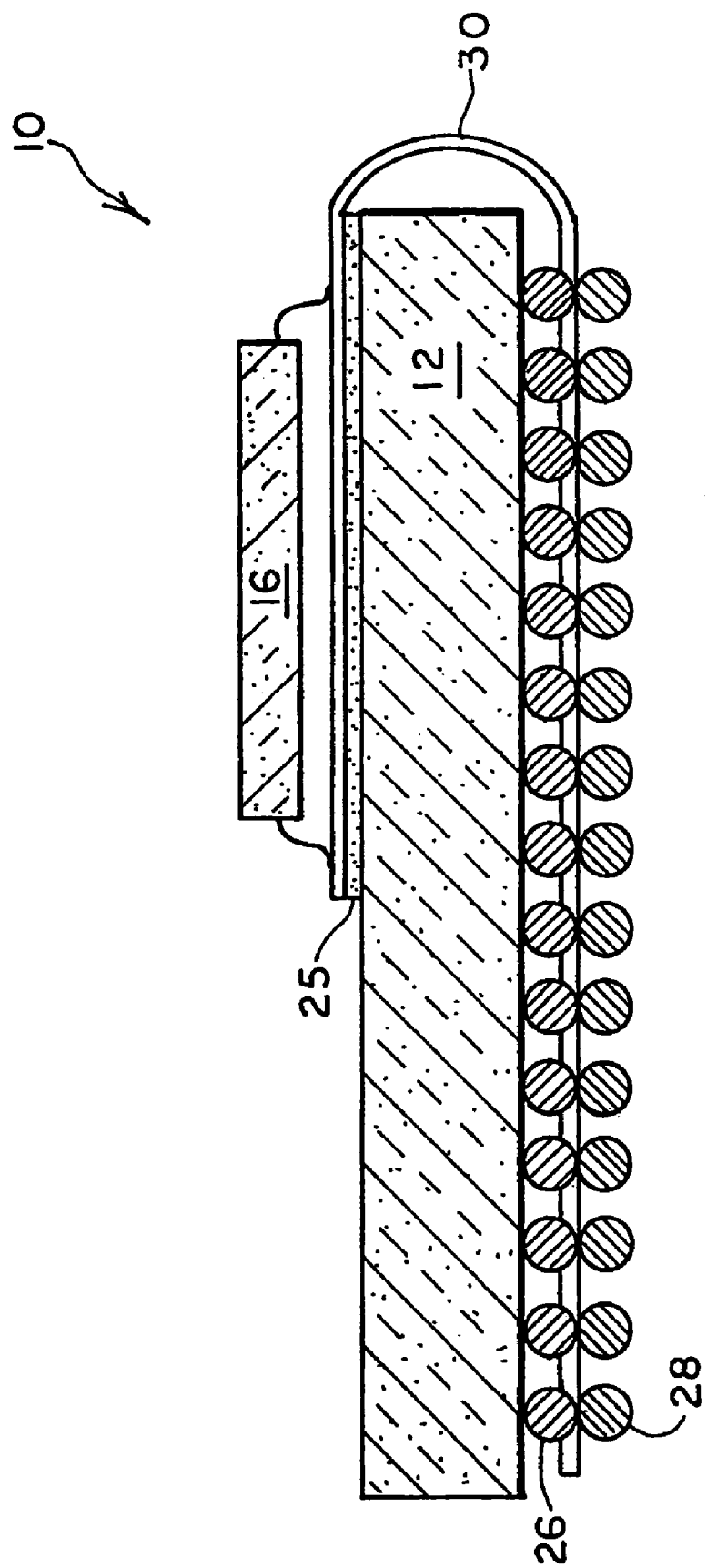
FIG. 4 is an elevation view of module 10 devised in accordance with an alternative preferred embodiment of the present invention.
Figure 5:
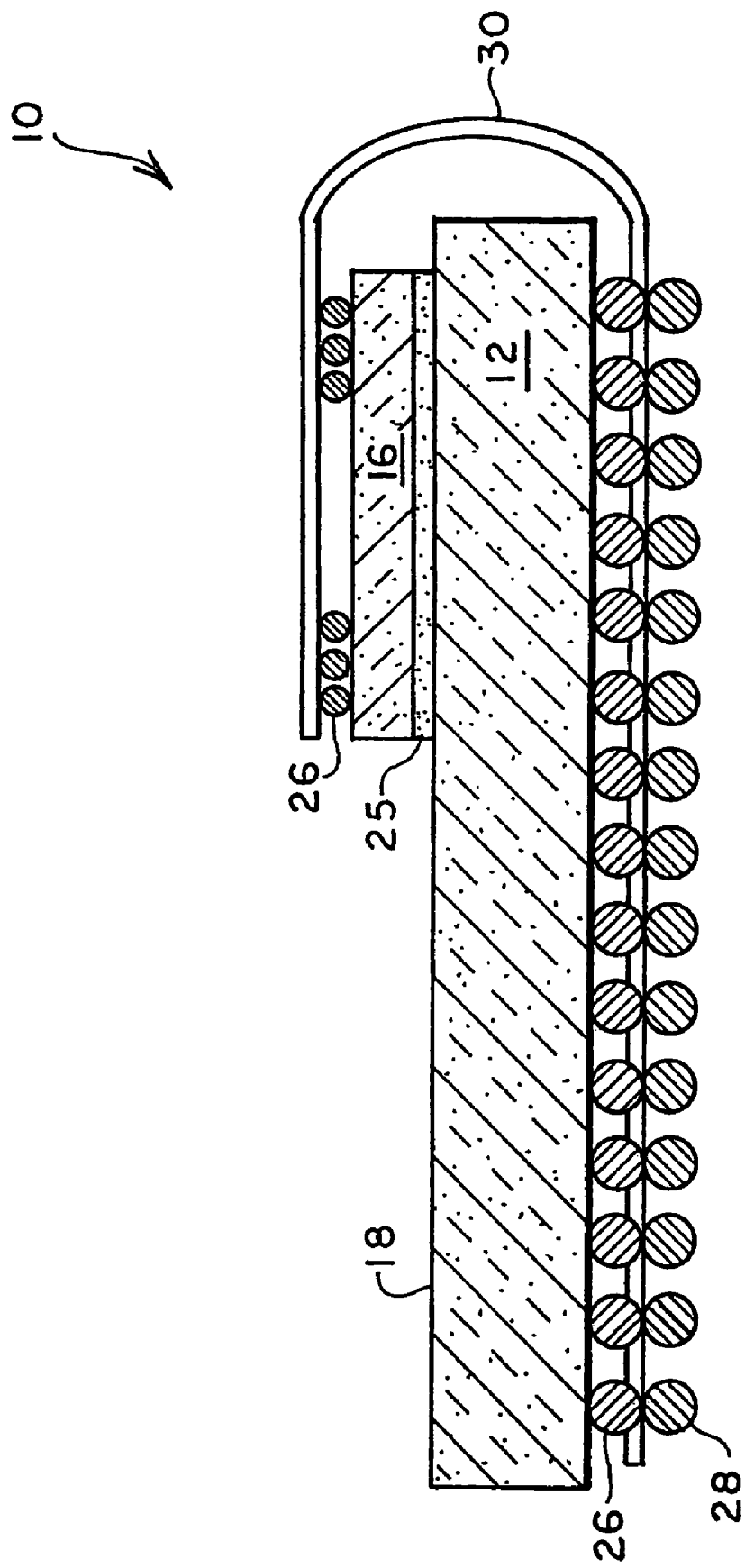
FIG. 5 is an elevation view of module 10 devised in accordance with an alternative preferred embodiment of the present invention.

FIG. 3 depicts another alternative embodiment of the present invention. Shown are base element 12 and support element 14. In the place of previously shown single package support element 16 is leaded stack 17, consisting of upper IC 19 and lower IC 21. In this embodiment, stack 17 is configured in conformity with a product of the assignee of the present invention but is intended to be an exemplar and not a limiting configuration. FIG. 4 illustrates an alternative preferred embodiment of the present invention in which a base element 12 is aggregated with a leaded support element 16. FIG. 5 depicts an alternative preferred embodiment of the present invention. Shown in FIG. 5 is a back-to-back embodiment with base element 12 having mounted upon its upper side 18, a support element 16 configured in CSP.

Figure 6:
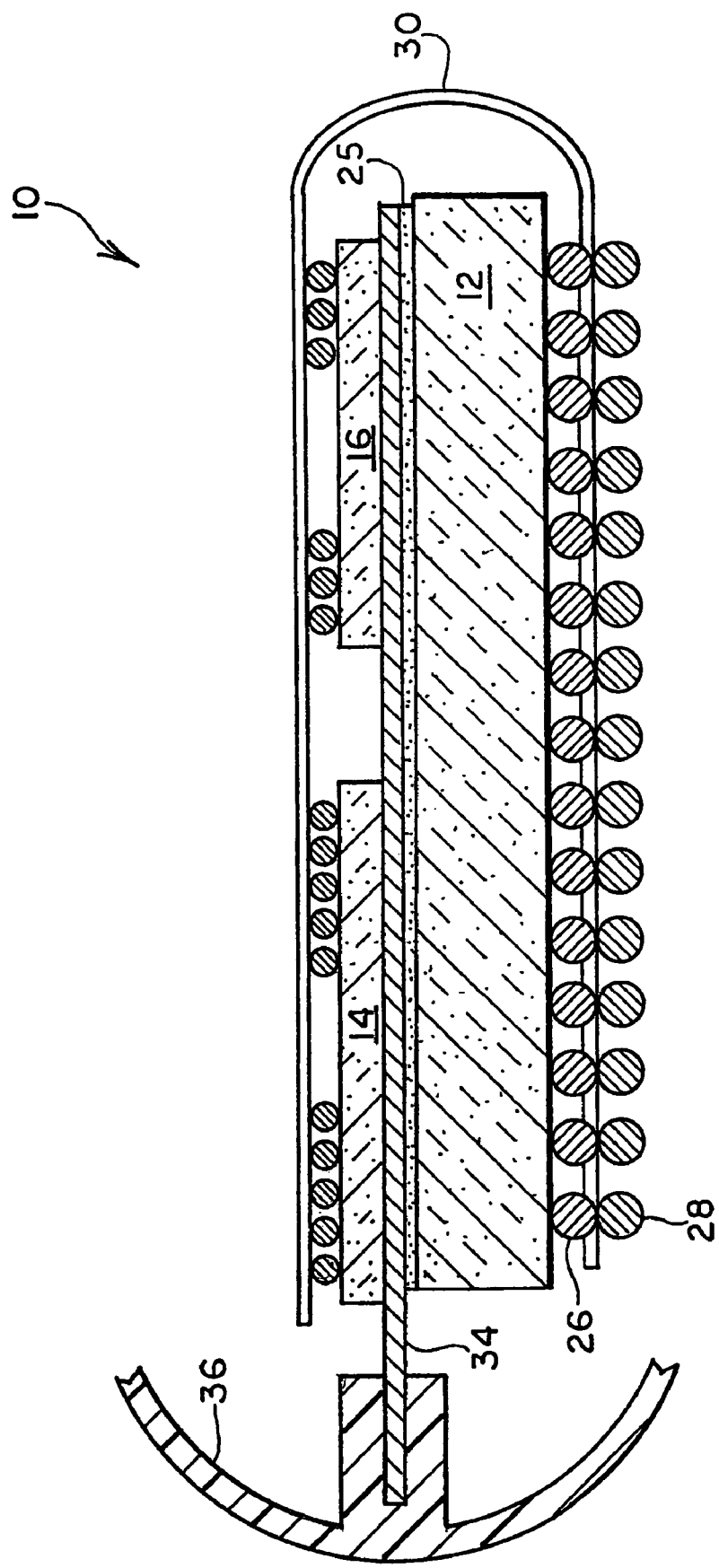
FIG. 6 is an elevation view of module 10 devised in accordance with an alternative preferred embodiment of the present invention.

FIG. 6 depicts a preferred embodiment of the present invention that employs a CSP base element 12 and CSP support elements 14 and 16 interconnected with flex 30. Heat sink 34 is disposed between base element 12 and support elements 14 and 16. As shown in FIG. 6, heat sink 34 is in contact with a portion of casing 36 of an application in which module 10 is employed.

Figure 7:
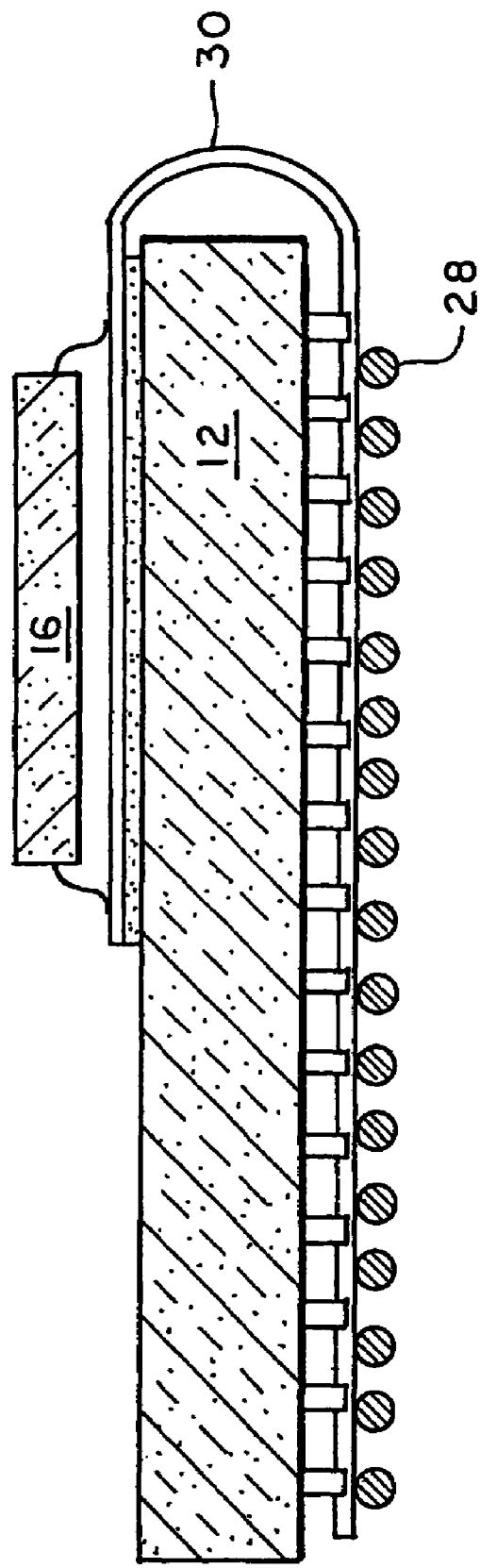
FIG. 7 is still another view of an alternative embodiment devised in accordance with the invention.

FIG. 7 illustrates an alternative preferred embodiment of the invention employed to aggregate leaded packages. Depicted base element 12 is a leaded device while support element 16 is also a leaded device.

Figure 8:
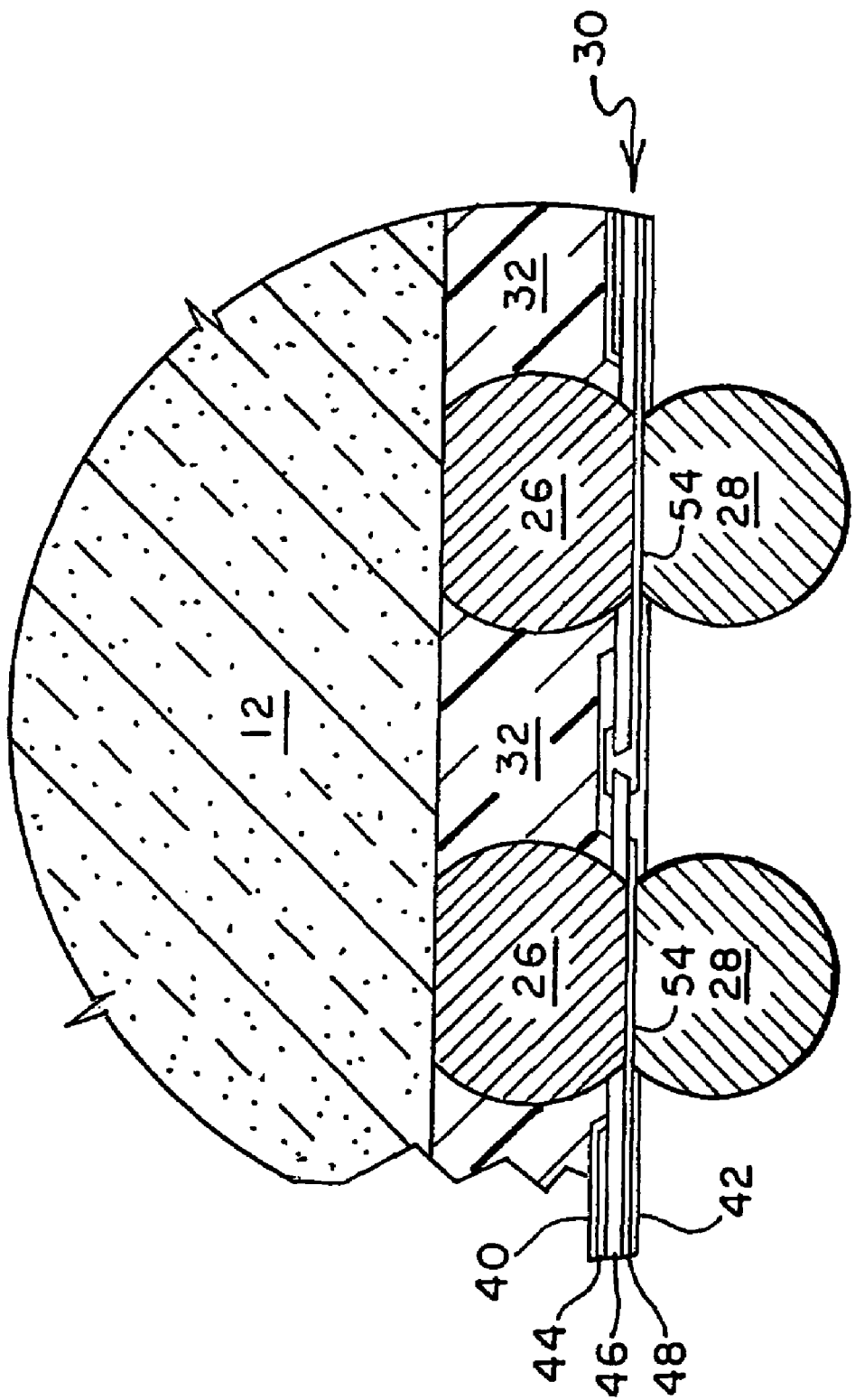
FIG. 8 depicts, in enlarged view, the area marked "A" in FIG. 1.

FIG. 8 depicts in enlarged view, the area marked "A" in FIG. 1. FIG. 8 illustrates the connection between example CSP contacts 26 and module contacts 28 through flex 30. A depicted preferred construction for flex 30 is shown in FIG. 8 to be comprised of multiple layers. Flex 30 has a first outer surface 40 and a second outer surface 42. Flex circuit 30 has at least two conductive layers interior to first and second outer surfaces 40 and 42. There may be more than two conductive layers in flex 30. Further, two flex circuits may supplant flex 30 with each wrapping about an opposite side of the assembly. In the depicted preferred embodiment, first conductive layer 44 is at the first conductive layer level of flex 30 while second conductive layer 48 is at the second conductive layer level of flex 30. Typically, both conductive layers are interior to first and second outer surfaces 40 and 42. Intermediate layer 46 lies between first conductive layer 44 and second conductive layer 48. There may be more than one intermediate layer, but an intermediate layer of polyimide is preferred. Similar dielectric materials may be used.

As depicted in FIG. 8 and seen in more detail in later figures, base flex contact 54 is preferably comprised from metal at the level of second conductive layer 48 interior to second outer surface 42. Base flex contact 54 is solid metal in a preferred embodiment and is preferably comprised of copper and suitable barrier metals or coatings as required. This results in a solid metal pathway from element 12 to an application board thereby providing a significant thermal pathway for dissipation of heat generated in module 10. This depiction of base flex contact 54 illustrates the solid metal path from element 12 to module contact 28 and, therefore, to an application PWB to which module 10 is connectable. As those of skill in the art will understand, heat transference from module 10 is thereby encouraged.

With continuing reference to FIG. 8, CSP contact 26 and module contact 28 together offset module 10 from an application platform such as a PWB. The combined heights of CSP contact 26 and module contact 28 provide a moment arm longer than the height of a single CSP contact 26 alone. This provides a longer moment arm through which temperature-gradient-over-time stresses (such as typified by temp cycle), can be distributed and can be helpful particularly where element 12 contacts such as CSP contacts 26 become diminutive as a result of high density contact arrays resulting in small diameter CSP contacts.

Figure 9:
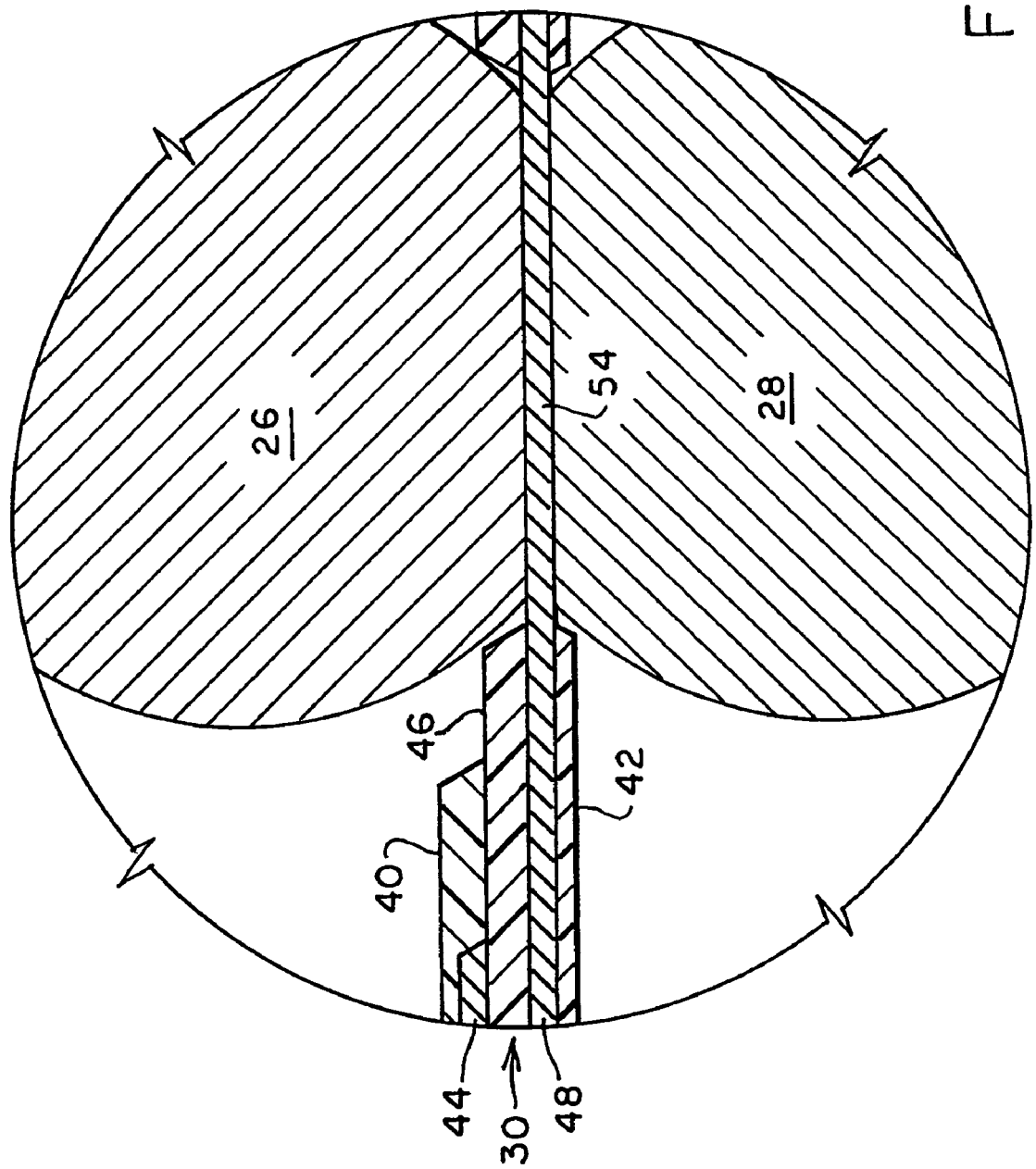
FIG. 9 is an enlarged detail of an exemplar connection in a preferred embodiment of the present invention.

FIG. 9 is an enlarged detail of an exemplar connection between example CSP contact 26 and example module contact 28 through base flex contact 54 to illustrate the solid metal path from element 12 to module contact 28 and, therefore, to an application PWB to which module 10 is connectable. As shown in FIG. 9, base flex contact 54 is at the level of second conductive layer 48 and is interior to first and second outer surface layers 40 and 42 respectively, of flex circuit 30. Base flex contacts 54 need not be at the level of second conductive layer 48 and may be configured from first conductive layer 44 depending upon the routing demands of the interconnections specified between elements 12 and 14 or 12 and 14 and 16.

Figure 10:
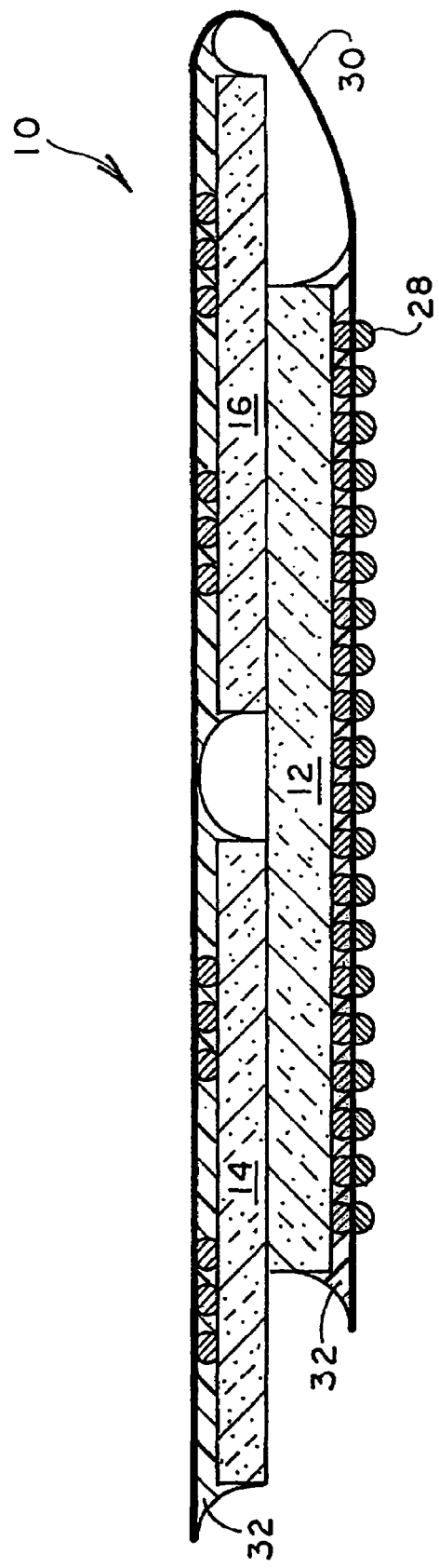
FIG. 10 is an elevation view of a preferred embodiment devised in accordance with the present invention.
Figure 11:
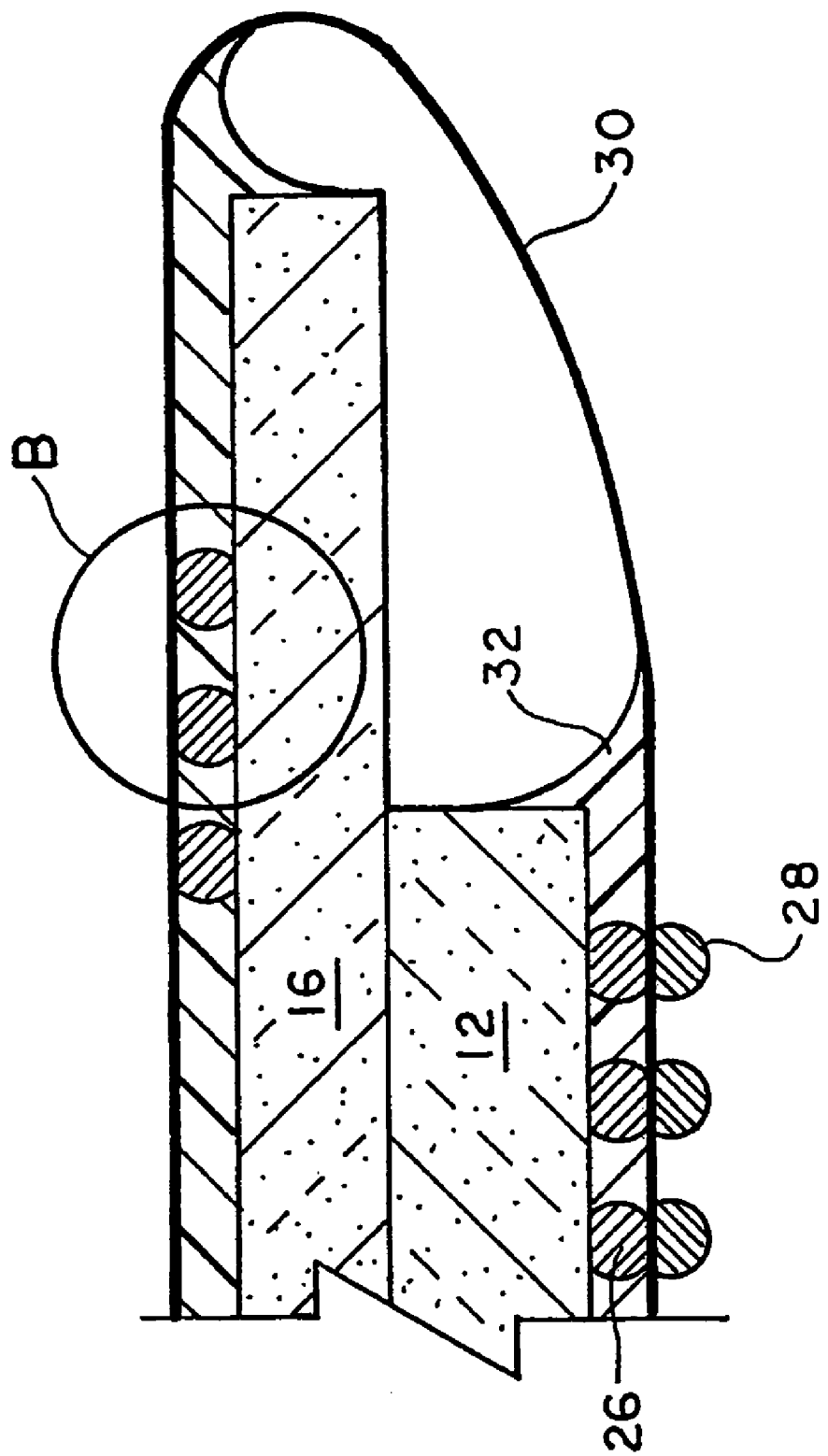
FIG. 11 is an enlarged depiction of a part of the view of FIG. 10.

FIG. 10 is an alternative preferred embodiment of the present invention. Depicted in FIG. 10 are base element 12 and support elements 14 and 16 with all of the depicted ICs being packaged in CSP with support elements 14 and 16 extending beyond the physical boundaries of base element 12. Also shown is extensive and preferred use of conformal underfill 32. FIG. 11 is an enlarged section of the preferred embodiment depicted in FIG. 10 and identifies an area "B" that will be further described in FIG. 12.

Figure 12:
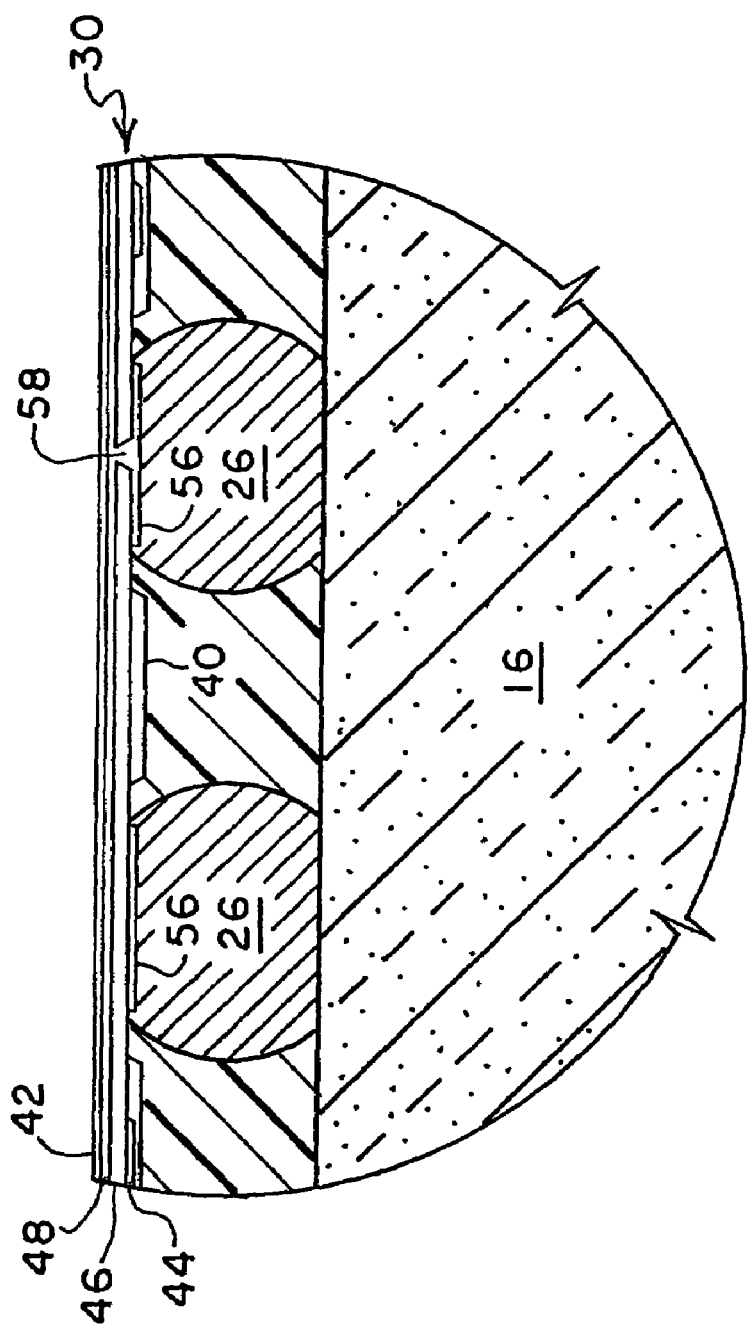
FIG. 12 depicts, in enlarged view, the area marked "B" in FIG. 11.

FIG. 12 illustrates in enlarged perspective, detail of the area marked "B" in FIG. 11 and illustrates an exemplar connection between example CSP contacts 26 of a support element and support flex contacts 56 of flex 30. In this depiction, support flex contacts 56 are shown as being at the level of first conductive layer 44 of flex 30. FIG. 12 illustrates a via 58 between the support flex contact 56 in contact with the rightmost depicted CSP contact 26 and second conductive layer 48. The use of vias between conductive layer levels allows flexibility in strategies employed to connect base element 12 with support elements and allows, for example, the connection of a contact from support elements 14 or 16 to a selected module contact 28. Often, support elements 14 and/or 16 will have signals that are not directly connected to base element 12, but which have functionality relevant to the operation of entire module 10. In such cases, a module contact 28 provides that signal connection to support element 14 or 16 without a corresponding direct connection to base element 12. Such a connection strategy is shown in FIG. 13.

Figure 14:
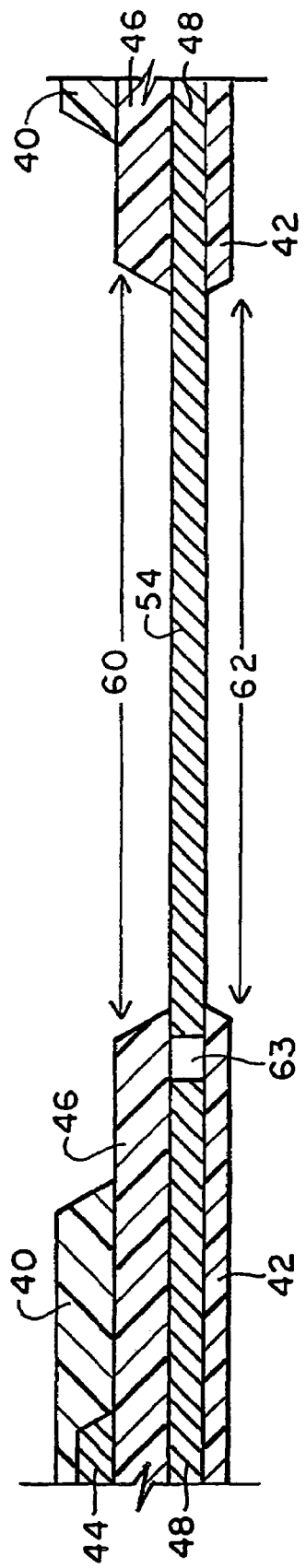
FIG. 14 is an enlarged depiction of an exemplar area around a base flex contact in a preferred embodiment of the present invention.

FIG. 14 is an enlarged depiction of an exemplar area around a base flex contact 54 in a preferred embodiment. The depicted base contact 54 is shown being delineated at the level of second conductive layer 48, but the many base element contacts 54 employed to provide connection to base element 12 may be located at the level of second conductive layer 48 or first conductive layer 44. Although it is not preferable, different base element contacts 54 for the same base element 12 may be located at different conductive layers. That is, some connection strategies may specify that some of the CSP contacts 26 of base element 12 should be connected to flex 30 through base element contacts 54 located at the level of second conductive layer 48, while at the same time, other CSP contacts 26 of base element 12 should be connected to flex 30 through base element contacts 54 located at the level of first conductive layer 44. It is preferable, however, to have all the contacts of base element 12 contact flex 30 at the same conductive layer level of the flex. In the FIG. 14 depiction of an example base contact 54, however, windows 60 and 62 are opened in first and second outer surface layers 40 and 42 respectively, to provide access to a particular exemplar base flex contact 54 residing at the level of second conductive layer 48 in the flex. Base flex contact 54 as is shown in FIG. 14 may be connected to or isolated from the conductive plane of second conductive layer 48. Demarking a lower flex contact 54 from second conductive layer 48 is represented in FIG. 14 by demarcation gap 63 shown at second conductive layer 48. Where a base flex contact 54 or support flex contact 56 is not completely isolated from its conductive layer, demarcation gaps do not extend completely around the flex contact.

As shown by example in FIG. 14, CSP contacts 26 of base element 12 pass through a window 60 opened through first outer surface layer 40, first conductive layer 44, and intermediate layer 46, to contact depicted base flex contact 54. Window 62 is opened through second outer surface layer 42 through which module contacts 28 pass to contact base flex contact 54. Where the base flex contact 54 to be contacted is at the level of first conductive layer 44, window 62 passes through second outer surface layer 42 as well as second conductive layer 48 and intermediate layer 46 to reach the level of first conductive layer 44 where the appropriate base flex contact is located while window 60 would pass only through first outer surface layer 40. As earlier shown in FIG. 13, there need not be a window 60 for every window 62 where a module contact 28 provides connection only to a support element. Similarly, there need not be a window 62 for every window 60 when there is no module contact 28 in physical proximity to a particular base element 12 CSP contact. Where base element 12 is a leaded package, pads connected by vias to appropriate conductive layers are employed with flex 30.

Figure 13:
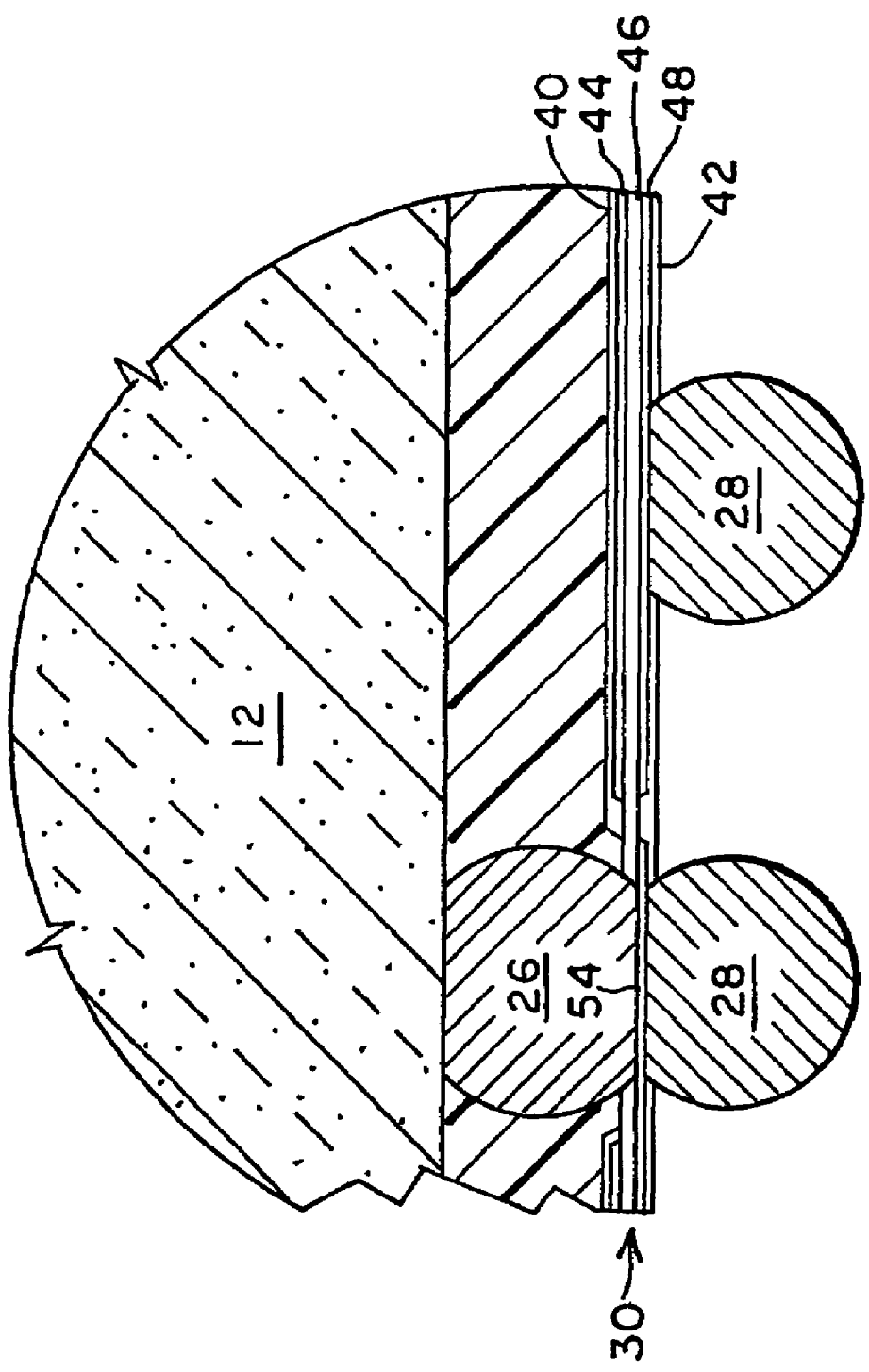
FIG. 13 depicts in enlarged view, an alternative connection strategy between constituent elements of the module and a flex in a preferred embodiment in accordance with the present invention.

With continuing reference to FIGS. 13 and 14, module contacts 28 pass through windows 62 opened in second outer layer 42 to contact base flex contacts 54. In those embodiments such as that shown in FIG. 13 that show module 10 exhibiting an array of module contacts 28 having a greater number of module contacts 28 than the base element 12 exhibits in CSP or other contacts 26, module 10 can express a wider interface for address, data, and control signals than that expressed by the constituent elements 12, 14 and 16. Further, a module contact 28 may also be employed to convey separate enable signals through conductive layer levels to support elements 14 or 16 and thereby provide locations through which support elements 14 or 16 may be selectably enabled.

Depending upon the frequencies employed by the elements of module 10, the dedication of one of the conductive layers of flex 30 to a particular functionality such as ground or power is typically not required for lower frequency applications. In other applications where higher speeds are encountered or where longer trace lengths beyond the critical length are employed, impedance controlling planes can be used or return paths (power or ground) can be routed next to such traces as a coplanar waveguide.

Figure 15:
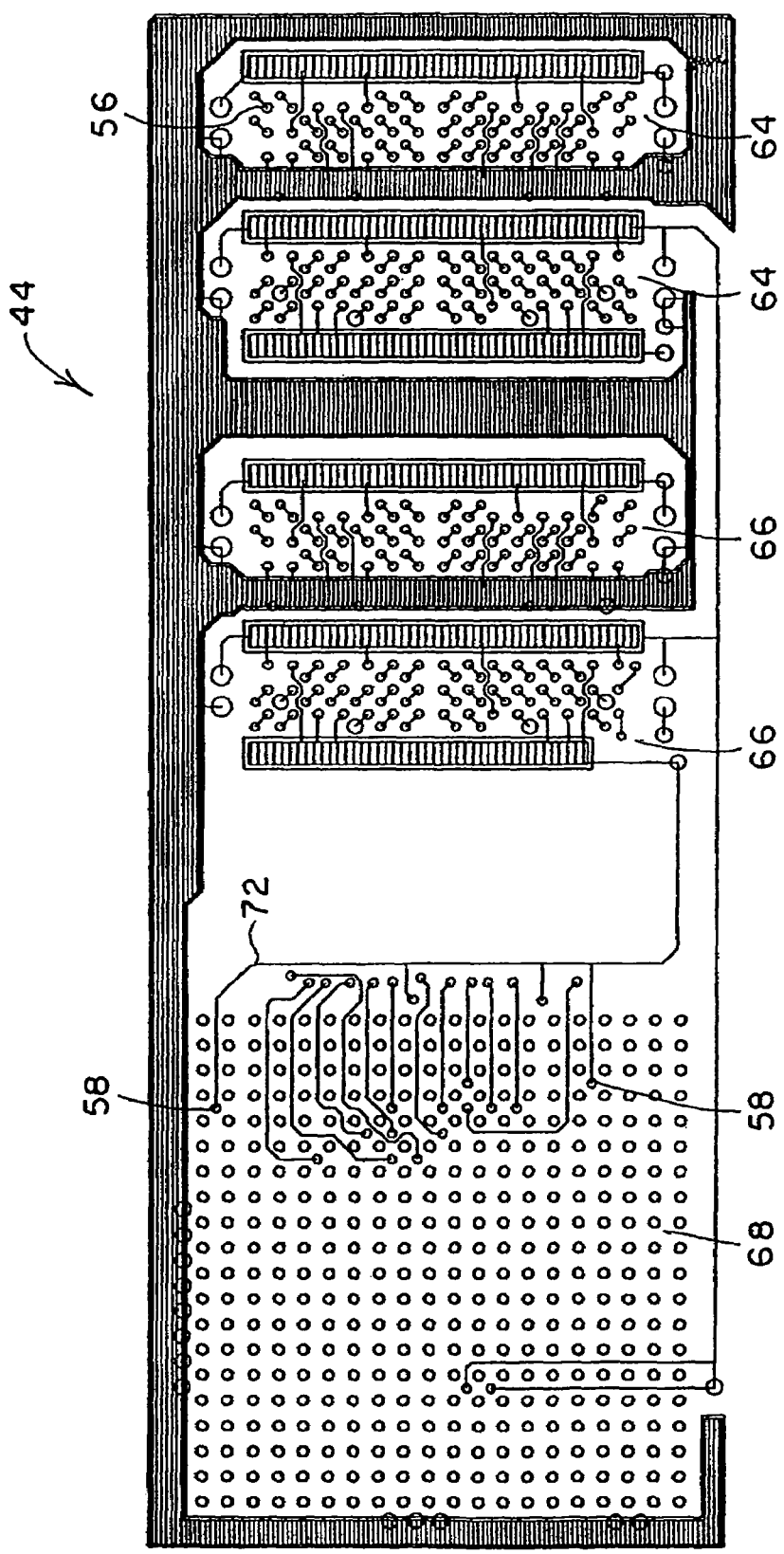
FIG. 15 depicts an exemplar first conductive layer of a flex employed in a preferred embodiment of the invention.

FIG. 15 depicts an abstraction of a typical routing employed in first conductive plane 44 by the assignee of the present invention in implementing a preferred embodiment of the present invention. FIG. 15 illustrates an abstraction of the plot employed for the conductive areas of at the level of first conductive plane 44 for the preferred embodiment depicted in FIG. 10. As those of skill will notice, in the plot shown in FIG. 15, the connective fields identified with references 64 provide connections for support element 14 while connective fields identified with references 66 provide connections for support element 16. Connective field 68 provides connections for base element 12. The connective fields 64 and 66 provide support flex contacts 56 as well as traces that, combined with vias 58, provide part of the connective facility for interconnecting support elements 14 and 16 to base element 12. The view is abstracted with many of the actual routing lines removed to assist in the clarity of the view.

Figure 16:
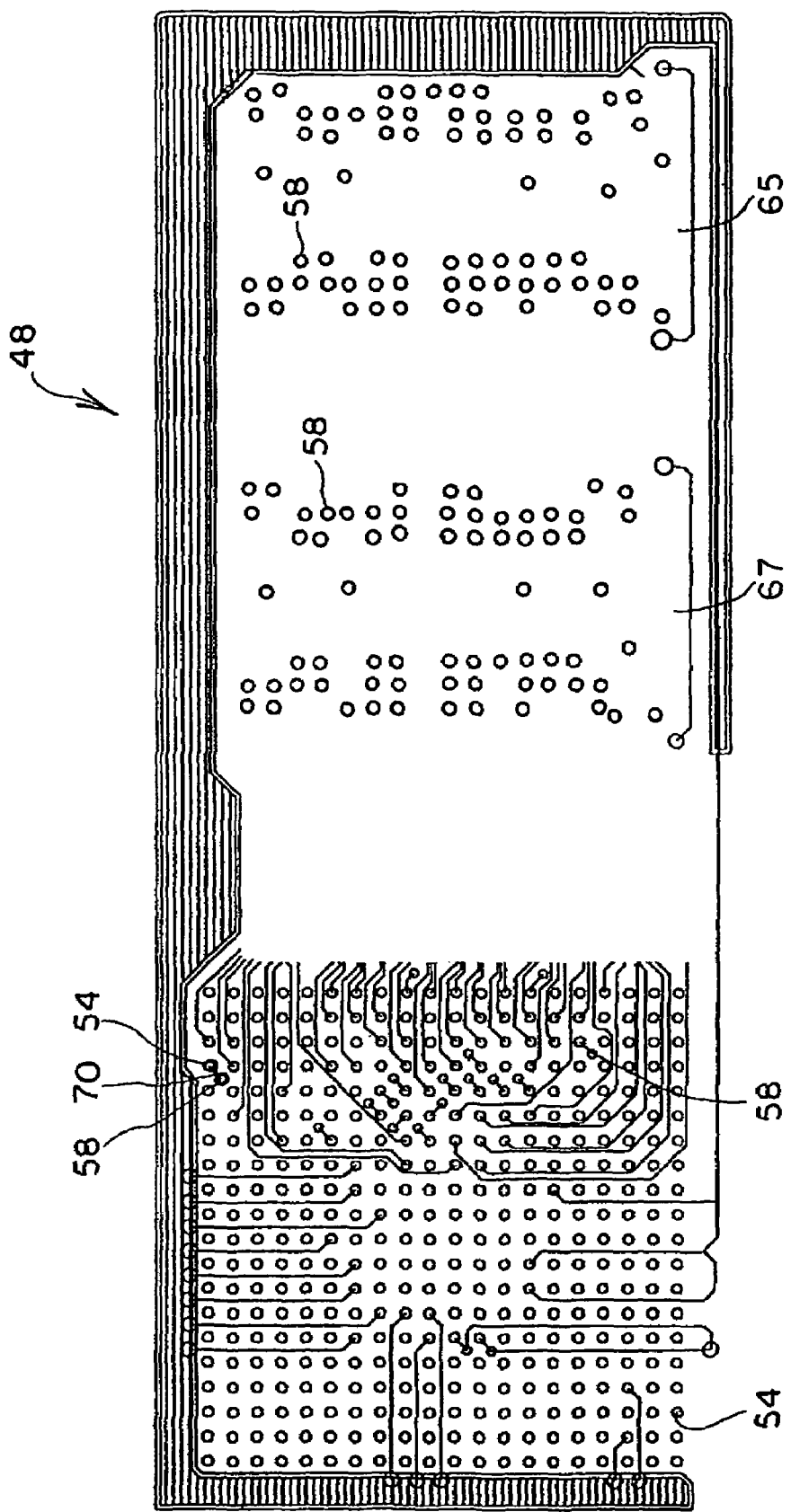
FIG. 16 depicts an exemplar second conductive layer of a flex employed in a preferred embodiment of the invention.

FIG. 16 depicts an abstraction of a typical routing employed for conductive areas at the level of second conductive plane 48 by the assignee of the present invention in implementing a preferred embodiment of the present invention. FIG. 16 illustrates an abstraction of the plot employed for the preferred embodiment depicted in FIG. 10.

In the area of FIGS. 15 and 16 employed to connect base element 12, there is illustrated an example of using vias 58 to more fully employ the two conductive layers of the preferred embodiments. Connective fields 65 and 67 indicate vias 58 as well as traces (that are not shown in the depiction for clarity of view) that provide part of the connective facility for interconnecting support elements 14 and 16 to base element 12.

On the depiction of FIG. 16, there is found the identification of a base flex contact 54. With reference to earlier FIGS. 13 and 14, base element 12 has a CSP contact 26 that passes through window 60 and therefore, first conductive layer 44 shown in FIG. 15, to contact the base flex contact 54 at the level of the second conductive layer as shown in FIG. 16. It should be understood that this is a heuristic explanation and meant to be merely an example illustrating a feature found in some preferred embodiments of the invention.

Base flex contact 54 at the level of second conductive layer 48 is connected to a via 58 by a trace 70. Via 58 passes in a relatively upward direction toward the body of base element 12. As via 58 passes upwardly through flex 30, it contacts a conductive area at the level of first conductive layer 44 as shown in FIG. 15 by the identification of via 58. Via 58 is then connected to trace 72 that provides a connection network to a variety of other contacts in the depicted embodiment. For example, trace 72 branches to connect to another via 58 identified in the lower part of FIG. 15. Thus, the use of two conductive layers is given an added flexibility by the illustrated use of vias through an intermediate layer.

Vias that route through intermediate layer 46 to interconnect traces or flex contacts or conductive areas at different conductive layers may be "on-pad" or coincident with the support or base flex contact to which they are connected. Such vias may also be "off-pad" and located near windows associated with the flex contacts from which signals are to be conveyed to another conductive layer. This provides added flexibility to connection schemes and layout routing. Another explication of the use of on-pad and off-pad vias that is suitable for use in the present invention is provided in incorporated and pending U.S. application Ser. No. 10/005,581, filed Oct. 26, 2001. Therein there is also found strategies for interconnection of elements using a multi-layer flex circuit that dedicates conductive layers to particular functions. Such a strategy may be used with the present invention where the simplicity of the interconnection allows.

As those of skill will recognize, the connection between conductive layers provided by vias (on or off pad) may be provided by any of several well-known techniques such as plated holes or solid lines or wires and need not literally be vias.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A circuit module comprising:
    a base element CSP integrated circuit comprising a first and second set of contacts;
    a support dement CSP integrated circuit comprising a first and a second set of contacts and;
    a flex circuit having a first end portion disposed substantially in a plane underneath the base element CSP integrated circuit and a second end portion disposed substantially in a plane above the base element CSP integrated circuit but below the support element CSP, the flex circuit further having at least a first and second conductive layers, the first conductive layer providing an electrical connection between the first set of contacts of the base element CSP integrated circuit and the first set of contacts of the support element CSP integrated circuit and the second conductive layer providing an electrical connection between the second set of contacts of the support element CSP integrated circuit and the second set of contacts of the base element CSP integrated circuit;
    the first conductive layer is disposed at a first conductive layer level of the flex circuit and the second conductive layer is disposed at a second conductive layer level of the flex circuit and a via transits between the first and second conductive layer levels.

2. The module of claim 1 in which traces participate in the connection between the first set of contacts of the base element CSP integrated circuit and the first set of contacts of the support element CSP integrated circuit provided by the first conductive layer.

3. The module of claim 1 in which traces participate in the connection between the second set of contacts of support element CSP integrated circuit and the second set of contacts of the base element CSP integrated circuit provided by the second conductive layer.

4. The module of claim 1 in which there are a plurality of vias that connect selected contact areas of the first and second conductive layers.

5. The module of claim 1 in which the flex circuit is a rigid-flex.

6. The module of claim 1 in which the flex circuit is flexible in certain areas and rigid in other areas.

7. The module of claim 1 further comprising a support element leaded package integrated circuit.

8. The module of claim 7 in which the support element CSP integrated circuit and the support element leaded package integrated circuit are disposed in a coplanar stacked conjunction above the base element CSP integrated circuit.

9. A circuit module comprising:
    a base element CSP integrated circuit comprising a first and a second set of contacts;
    a first support element comprising a first and a second set of contacts;
    a second support element comprising a first and a second set of contacts, the first and second support elements being in stacked conjunction above the base element CSP integrated circuit;
    a flex circuit having a first end portion disposed substantially in a plane underneath the base element CSP integrated circuit and a second end portion disposed substantially in a plane above the base element CSP integrated circuit but below the first and second support elements, the flex circuit further having a conductive layer level at which there is a first set of conductive areas selected ones of which are in contact with the first set of contacts of the base element CSP integrated circuit and electrically connected to the first set of contacts of the first support element, and the first set of contacts of the second support element and the flex circuit having at the conductive layer level a second set of conductive areas selected ones of which are in contact with the second set of contacts of the base element CSP integrated circuit, and electrically connected to the second set of contacts of the first support element and the second set of contacts of the second support element.

10. The module of claim 9 in which the first support element comprises a CSP integrated circuit and the second support element comprises a leaded package integrated circuit.

11. The module of claim 10 in which the first and second support elements are disposed in a coplanar stacked conjunction above the base element CSP integrated circuit.

12. A circuit module comprising:
   a base element CSP integrated circuit having a plurality of contacts;
   a first support element having a plurality of contacts:
   plural module contacts; and
   a flex circuit having a first end portion and a second end portion, the second end portion disposed substantially in a plane above the base element CSP integrated circuit but below the first support element and the second end portion being disposed substantially beneath the base element CSP integrated circuit, the flex circuit having at least first and second conductive layers, the first conductive layer comprising a first conductor configured as at least part of an electrical connection between the base element CSP integrated circuit, the first support element, and a module contact; and
   the first conductor of the first conductive layer comprises a trace; and the second conductive layer comprises a second conductor configured as at least part of an electrical connection between the base CSP integrated circuit, the first support element, and a module contact.

13. The module of claim 12 in which at least one contact of the base element CSP is in contact with the first conductor of the first conductive layer.

14. The module of claim 12 in which at least one contact of the first support element is in contact with the first conductor of the first conductive layer.

15. The module of claim 12 in which, the second conductor of the second conductive layer comprises a ground plane.

16. The module of chin 12 in which the first support element comprises a leaded package integrated circuit.

17. The module of claim 12 further comprising a second support element having a plurality of contacts.

18. The module of claim 17 in which the first support element comprises a leaded package integrated circuit and the second support element comprises a CSP integrated circuit.

19. The module of claim 18 in which the first and second support elements are disposed in a coplanar stacked conjunction above the base element CSP integrated circuit.

20. The module of claim 19 in which:
   the flex circuit has first and second major sides;
   the plurality of contacts of the base element CSP integrated circuit are connected to the flex circuit along the first major side of the flex circuit; and
   the plurality of contacts of the first support element, the plurality of contacts of the second support element, and the plural module contacts are connected to the flex circuit along the second major side of the flex circuit.

\* \* \* \* \*